(12) United States Patent
Hariharan et al.

(10) Patent No.: US 7,268,563 B2
(45) Date of Patent: Sep. 11, 2007

(54) MEASUREMENT OF POINT CONTACT ANDREEV-REFLECTION CHARACTERISTICS OF HALF-METALLIC THIN FILMS

(75) Inventors: Srikanth Hariharan, Tampa, FL (US); Jeff T. Sanders, Tampa, FL (US)

(73) Assignee: University of South Florida, Tampa, FL (US)

( * ) Notice: Subject to any disclaimer, the term of this patent is extended or adjusted under 35 U.S.C. 154(b) by 36 days.

(21) Appl. No.: 11/162,057

(22) Filed: Aug. 26, 2005

(65) Prior Publication Data

US 2007/0046297 A1  Mar. 1, 2007

Related U.S. Application Data

(63) Continuation of application No. PCT/US04/06219, filed on Mar. 1, 2004.

(60) Provisional application No. 60/319,990, filed on Mar. 4, 2003, provisional application No. 60/319,981, filed on Feb. 28, 2003.

(51) Int. Cl.
*G01R 27/04* (2006.01)
(52) U.S. Cl. .............. 324/631; 324/724; 324/248; 324/244
(58) Field of Classification Search ............. 324/631, 324/724, 248, 244
See application file for complete search history.

(56) References Cited

U.S. PATENT DOCUMENTS

| | | | |
|---|---|---|---|
| 5,585,736 A | 12/1996 | Hshieh et al. | |
| 5,621,210 A | 4/1997 | Lindsay | |
| 6,017,590 A | 1/2000 | Lindsay et al. | |
| 6,344,659 B1 | 2/2002 | Ivanov et al. | |
| 6,646,250 B2 | 11/2003 | Eigler et al. | |

OTHER PUBLICATIONS

Pangulari et al., Point contact spin spectroscopy of ferromagnetic McAs epitaxial films, Phys. Rev. B, V. 68, 201307(R), 2003.*
Keithley Instruments Inc., Catalog and Reference, 1998. p. 10, 11, A-82-87.*

(Continued)

*Primary Examiner*—Walter Benson
*Assistant Examiner*—Thomas Valone
(74) *Attorney, Agent, or Firm*—Ronald E. Smith; Smith & Hopen, P.A.

(57) ABSTRACT

An apparatus for measuring spin polarization via Point Contact Andreev Reflection (PCAR) at a magnet-superconductor junction, with variable magnetic fields and temperature control. A cryostat probe investigates superconducting energy gap and Andreev reflection in superconductor-half metal junctions, in a wide range of magnetic fields and temperature from 2K-300K. The cryostat probe is integrated with a commercial physical properties measurement system. The measurement probe includes a rotary-translation stage with coarse and fine screws that enable a user to make point contacts in a cryogenic, evacuated environment where the point contact junction can be controlled at room temperature by turning a knob. Copper wires are connected as electrical leads from an aluminum housing, descend down to a copper housing, for measurement, when contact is made by tip with a half-metal sample, such as $CrO_2$. External current and voltage meters measure the current-voltage characteristics and data acquisition is performed using computer interface.

16 Claims, 11 Drawing Sheets

OTHER PUBLICATIONS

Bugoslavsky et al. Possibilities and limitations of point-contact spectroscopy for measurements of spin polarization, Phys. Rev. B, V. 71, 104523, 2005.*

Woods et al., Analysis of point-contact Andreev reflection spectra in spin polarization measurements, Phys. Rev. B, V. 70, 054416, 2004.*

M.S Osofsky et al., Measurements of the transport spin-polarization of oxides using Point Contact Andreev Reflection (PCAR), Elsevier Science B.V, 2000, and pp. 1527-1530.

Y. Ji et al., Measurements of spin polarization of single crystals of La0.7Sr0.3MnO3 and La0.6Sr0.4MnO3, The American Physical Society, 2002 and pp. 012410-1-012410-4.

Y. Ji et al., Determination of the Spin Polarization of Half-Metallic CrO2 by Point Contract . . . , The American Physical Society, Jun. 11, 2001, and pp. 5585-5588.

J. Sanders et al., Point-contact Amdreev Reflection (PCAR) investigation of half-metal films with temperature . . . , American Physical Society,Mar. 3-7, 2003, and Austin, TX.

W.J. Desisto et al., Highly spin-polarized chromium dioxide thin films prepared . . . , American Institute of Physics, Jun. 19, 2000, pp. 3789-3791, and vol. 76, No. 25.

R.J. Soulen et al., Measuring the Spin Polarization of a Metal with a Superconducting Point Contact, Oct. 2, 1998, pp. 85-88, and vol. 282.

L. Ozyuzer et al., Point contact tunnelling apparatus with temperature and magnetic field control, Elsevier Science Ltd., 1998, pp. 911-915, and vol. 3, No. 9.

* cited by examiner

MEASUREMENT OF POINT CONTACT ANDREEV-REFLECTION CHARACTERISTICS OF HALF-METALLIC THIN FILMS

CROSS-REFERENCE TO RELATED DISCLOSURES

The present application is a continuation application filed under 35 U.S.C. § 111 claiming the benefit of prior filed International Application, Ser. No. PCT/US2004/006219, filed on Mar. 1, 2004, which International Application claims a priority date of Feb. 28, 2003 based on prior filed U.S. provisional patent application Ser. No. 60/319,981 and a priority date of Mar. 4, 2003 based on prior filed U.S. provisional patent application Ser. No. 60/319,990.

BACKGROUND OF THE INVENTION

1. Field of the Invention

This invention relates to methods of measuring physical properties of highly spin-polarized (half-metallic) ferromagnetic materials and superconductors.

2. Description of the Prior Art

Spin polarized transport effects in materials is an important and rapidly developing area of basic research and technology. This new field, known as magnetoelectronics, is spurring the development of new devices that cannot be realized with existing charge-based semiconductor electronics. A central component of these devices is ferromagnetic materials which are ideally 100% spin polarized, in which the conduction electrons have only one spin state available at the Fermi energy. Recent point contact experiments have indicated that the spin polarization in chromium dioxide ($CrO_2$) approaches 100%, as disclosed in an article by R. J. Soulen et al., Science 282, 85 (1998). Ultra-thin layers of highly spin-polarized $CrO_2$ have potential applications in giant magnetoresistance (GMR) devices.

According to Osofsky et al., Physica C341-348 (2000) 1527-1530, these new classes of electronic devices have properties that are determined by the electron spin. The performance of these devices is enhanced as the spin polarization, P, of the ferromagnetic components increase. A ferromagnetic metal has excess electrons with one spin orientation and is characterized by majority and minority spin sub-bands. The total magnetic moment of a ferromagnetic metal is the difference of the moments of the electrons in the majority and minority sub-bands. Transport current is the sum of currents from majority and minority conduction bands. A spin polarized current results when the conductivities of two conduction bands are not equal.

Soulen et al. have shown that spin polarization P can be determined by using point contact conductance measurements with a superconducting tip and interpreting the results using the Blonder-Tinkham-Klapwijk (BTK) model of Andreev reflection at a normal/superconductor interface. This is generalized to include a spin polarized normal metal. Other demonstrations of similar techniques have also been developed, specifically for ferromagnetic materials by microlithography forming F/S point contacts.

In a conventional Andreev reflection process for a superconductor/unpolarized normal metal junction at T=0, where an electron approaches the S/N interface, a Cooper pair can enter as long as charge and spin are conserved. Conventional Andreev-reflection is characterized by a doubling of the normalized conductance, $G(V)/G_N$, below $\Delta/e$ where $G_N$ is the conductance for $V>>\Delta/e$. This is the result of a hole conductance channel opening up in N thus doubling the number of N carriers. Since the process is blocked for the 100% spin polarized N material, no current can flow, i.e. the conductance goes to zero for voltages below $\Delta/e$. Simple BTK analysis assumes ballistic contacts, spherical Fermi surfaces and particle-hole momentum conservation. Experiments have explored more realistic theoretical treatments.

Magnetic oxide thin films are used in applications including, but not limited to, media for magnetic recording, and in spintronic devices. Also, ferromagnetic oxide material can be used as memory storage material as part of a magnetic multilayer to store information in computer and hard drives. Fully spin-polarized material, called a "half-metal," behaves as an insulator for the transport of a first electron spin orientation and as a conductor for a second spin orientation.

In point contact Andreev-reflection (PCAR), a metallic point contact is formed between the spin polarized magnetic sample and a superconducting tip. Spin polarization of the sample is determined by the electronic transport properties at the point-contact junction between the tip and the sample.

There is a currently a great deal of research in a new field called "spintronics," where the manipulation of the spin of an electron could be incorporated into an electronic device. This would have the advantages of decreased power consumption, non-volatility, increased data processing speed, and increased integration densities compared to conventional semiconductor devices. One important aspect of spintronics is the fundamental research into the spin polarization value associated with any new material.

The experiments that have been conducted in this field of research do not have the range of magnetic field and temperature control that is required for certain half-metals and superconductive tips. What is needed is a reliable system of measuring spin polarization with both coarse and fine control and variability of magnetic field and temperature.

However, in view of the art considered as a whole at the time the present invention was made, it was not obvious to those of ordinary skill in this field how the needed system could be provided.

SUMMARY OF INVENTION

The long-standing but heretofore unfulfilled need for a highly controllable point contact measurement system that operates over a wide range of temperatures and magnetic fields is now met by a new, non-obvious and useful invention. The novel system includes a probe integrated with a Physical Properties Measurement System (PPMS).

More particularly, the invention includes a point contact Andreev-Reflection (PCAR) probe for use with a temperature and magnetic field control apparatus for measuring spin polarization of a sample with the use of a superconducting tip. The novel probe includes a custom-designed tubular insert that mates with the instrument base and places the point contact inside the bore of a superconducting magnet.

More specifically, the probe is for point contact of a superconducting tip to a sample to obtain Andreev-Reflection characteristics from current-voltage (I-V) data acquisition. Moreover, the probe is for use with a physical property measurement system and includes a metallic top housing having a bore and a first and second end. Connecting ports are attached to the metallic top housing and provide outlets for electrical connections to a voltmeter and sourcemeter. Conductive wires are electrically connected to the ports and are used for voltage measurement of the point contact and for electrical current conductance. A knurled knob has a threaded stem and is fitted onto the top part on the first end. The knob is rotated for coarse control, controlling movement of the tip closer to the sample in the physical property measurement system. Double O-rings are disposed within the metallic housing to provide a vacuum seal and yet maintain the freedom of rotation and translation of the probe. An elongated garolite tube is fitted into the top metallic housing. A re-bored bottom copper shaft is attached to the tube. The shaft has threaded portions and a micrometer is disposed therein. A sliding copper part is disposed within the bore of the bottom copper shaft. The sliding copper part moves the micrometer in a vertical plane. A lug is fitted around the micrometer and the lug has a shank for holding the tip. The sample is placed onto a puck that is used for resistivity measurements in the PPMS. When the tip comes into contact with the sample, spin polarization measurements are taken by recording the current-voltage characteristics across the point contact.

The invention further includes a point contact Andreev-Reflection measurement system that includes a probe integrated with a physical property measurement system having a temperature and magnetic field control. A sourcemeter supplies current to the probe. A voltage measurement device is connected to the probe. A computer with software is programmed to acquire data. The computer is connected to the sourcemeter and the voltage measurement device and the system is designed to measure the current-voltage curves of a sample. Conductance is obtained by numerical differentiation of this data.

The novel point contact probe for measuring spin polarization of a sample includes an elongate tube and a vacuum-sealed housing, preferably formed of aluminum, mounted to the elongate tube near a proximal end thereof. The elongate tube is preferably formed of a garolite which is a nonmetallic and nonmagnetic glass fabric woven into a resin. The elongate tube has a length between one-half to two meters and a preferred length of about one meter.

The vacuum-sealed housing is adapted for connection to a temperature and magnetic field control apparatus that preferably takes the form of a physical property measurement system. The temperature and magnetic field control apparatus is adapted to maintain a temperature within the probe within a temperature range of 2 to 300 degrees Kelvin and a magnetic field within the probe within a range of 0 to 70,000 Gauss.

A sample housing is secured to the tube near a distal end thereof and a tip holder is mounted within the sample housing. A superconducting tip, preferably formed of a metal selected from a group of metals consisting of nickel, lead, niobium and tin, extends from a distal end of the tip holder. The tip is adapted to measure the spin polarization of a thin film selected from a group consisting of Cu, $MgB_2$, and $CrO_2$. A sample holder adapted to hold a sample is secured to a distal end of the sample housing.

The invention further includes a control means for controlling a distance between the sample and the superconducting tip. The control means is adapted to retract and extend the superconducting tip away from and toward, respectively, the sample.

The vacuum-sealed housing is adapted for electrical connection to a sourcemeter and a voltmeter. The physical property measurement system is adapted to maintain a consistent low temperature within the probe of about 2 Kelvin. The sample is typically a thin film selected from a group consisting of Cu, $MgB_2$, and $CrO_2$. The superconducting tip is in electrical communication with the physical property measurement system and is preferably made of a metal selected from a group of metals consisting of Ni, Pb, Nb and Sn.

The control means includes a rotatably mounted coarse control knob positioned at a proximal end of the elongate tube. More particularly, the rotatably mounted coarse control knob is formed integrally with a coarse adjustment rod so that rotation of the coarse control knob in a first rotational direction effects simultaneous and corresponding rotation of the coarse adjustment rod in the first rotational direction and so that rotation of the coarse control knob in a second rotational direction opposite to the first rotational direction effects simultaneous and corresponding rotation of the coarse adjustment rod in the second rotational direction.

The control means further includes a differential micrometer, preferably formed of copper, that includes a shaft having a diameter-reducing annular shoulder formed therein that divides a first, large diameter proximal section of the shaft from a second, reduced diameter distal section of the shaft. The proximal section of the shaft is externally threaded and has a first preselected number of threads per unit length formed therein. The distal section of the shaft is also externally threaded and has a second preselected number of threads per unit length formed therein.

An internally threaded slider, formed of copper or titanium, is in screw-threaded engagement with the proximal section of the shaft and an internally threaded sleeve, preferably formed of titanium, is in screw-threaded engagement with the distal section of the shaft. The tip holder is mounted to a distal end of the internally threaded sleeve.

A micrometer rod is disposed in axial alignment with the coarse adjustment rod. A distal end of the coarse adjustment rod is disposed in abutting relation to a proximal end of the micrometer rod. A clamp means secures together the coarse adjustment rod and the micrometer rod. The differential micrometer includes an internally threaded boss that screw threadedly engages the coarse adjustment rod. Accordingly, rotation of the coarse adjustment rod in the first rotational direction causes the coarse adjustment rod to advance in a first linear direction and to bear against the micrometer rod and to displace the micrometer rod and hence the differential micrometer and the tip holder in the first linear direction. Rotation of the coarse adjustment rod in the second rotational direction causes the coarse adjustment rod to displace in a second linear direction opposite from the first linear direction and to displace the micrometer rod and hence the differential micrometer and the tip holder in the second linear direction.

The control means further includes a fine adjustment knob secured to a proximal end of the coarse adjustment rod. An elongate slot is formed in the slider and a setscrew opening is formed in the sample housing. A setscrew extends through the opening and into the elongate slot prevents rotation of the slider. The setscrew bears against a first side of the elongate slot when the fine adjustment knob is abruptly rotated in a first rotational direction so that continued rotation of said fine adjustment knob in the first rotational direction causes the differential micrometer to rotate in the first rotational direction relative to the slider and to travel in a first linear direction. The setscrew bears against a second side of the elongate slot when the fine adjustment knob is abruptly rotated in a second rotational direction opposite to the first rotational direction so that continued rotation of the fine adjustment knob in the second rotational direction causes the differential micrometer to rotate in the second rotational direction relative to the slider and to travel in a second linear direction opposite to the first linear direction.

The linear travel of the differential micrometer in the first direction causes the internally threaded sleeve and hence the tip holder to travel in a first linear direction toward the sample. The linear travel of the differential micrometer in the second direction causes the internally threaded sleeve and hence the tip holder to travel in a second linear direction away from the sample.

The novel point contact Andreev-Reflection measurement system is thus understood to include a probe integrated with a physical property measurement system having temperature and magnetic field controls where a sourcemeter supplies current to the probe and a voltage measurement device is connected to the probe. The system includes a computer having software programmed to acquire data. The computer is in communicating relation to the sourcemeter and the voltage measurement device and the probe is adapted to measure tunneling conductance of a sample.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. Other embodiments may be utilized and structural changes may be made without departing from the scope of the invention.

The novel scientific instrument disclosed herein measures the spin polarization of ferromagnetic materials. The novel instrument makes the measurements at temperatures from 2K to 300K and in magnetic fields of 0 to 70,000 Gauss, and is the only instrument in the world with these capabilities.

New spin devices can be researched when a material is identified to have a high polarization value by the novel instrument disclosed herein. One such device is a "spin-transistor" and is currently being explored by many labs and companies. A new class of spintronic devices could possibly revolutionize the world of electronics.

Point contact tunneling from a low temperature superconductor into a ferromagnet is used to determine the spin polarization of various ferromagnetic thin films. Specifically, the spin polarization is measured by the point contact Andreev-Reflection (PCAR) technique. In the field of magnetoelectronics, this new class of electronic devices has properties that are determined by the electronic spin. The performance of such devices is enhanced as the spin polarization of the ferromagnetic component increases. A ferromagnetic metal has excess electrons with one spin orientation and is characterized by majority and minority spin sub-bands.

Spin polarization can be determined by using point contact conductance measurements with a superconducting tip. The present invention uses Sn tips on $CrO_2$ film for PCAR. The tips may be prepared by conventional mechanical polishing of Sn wires, followed by electrochemical etching. $CrO_2$ is a versatile magnetic oxide for applications in memory storage and spin based devices. $CrO_2$ is a model sample material. Other oxides with spin polarization properties can be measured in a similar manner.

To measure spin polarization of a sample, the novel probe is integrated with PPMS which is a stand-alone instrument manufactured by Quantum Design of San Diego, Calif. The PPMS has a sealed sample chamber with a 2.6 cm diameter sample access. The continuous low temperature control of the PPMS maintains temperature fixed at any value between 2K and 300K for indefinite periods of time and the temperature could be continuously swept up or down in this range. In the same system, independently, a fixed or swept magnetic field can be established using a superconducting magnet with a range of 0 to 70,000 Gauss. This instrument can be controlled automatically using Visual C++, Delphi or Visual Basic in the Widows based MultiVu control software, also provided by Quantum Design. Moreover, the Grapher utility displays data as it is being collected. Thus, the integration of the novel probe of this invention with the PPMS provides automated temperature control, as well as magnetic field control.

The PPMS equipment has variable temperature and field systems that perform a variety of automated measurements. The novel probe is used with the PPMS equipment for PCAR measurements with automated temperature and field control. To control the temperature, a vacuum pump draws helium into an annular region where heaters warm the gas to a predetermined correct temperature. Also, the sealed chamber may hold a high vacuum for temperature control. The PPMS provides a setup that contains a vacuum jacket in a liquid helium bath. The PCAR measurement system integrates with a commercial PPMS system, or any system that provides the cryogenic and magnetic environments similar to the ones used in the instant application or which can be used for conducting point contact tunnelling as well as other PCAR experiments.

Figure 1:
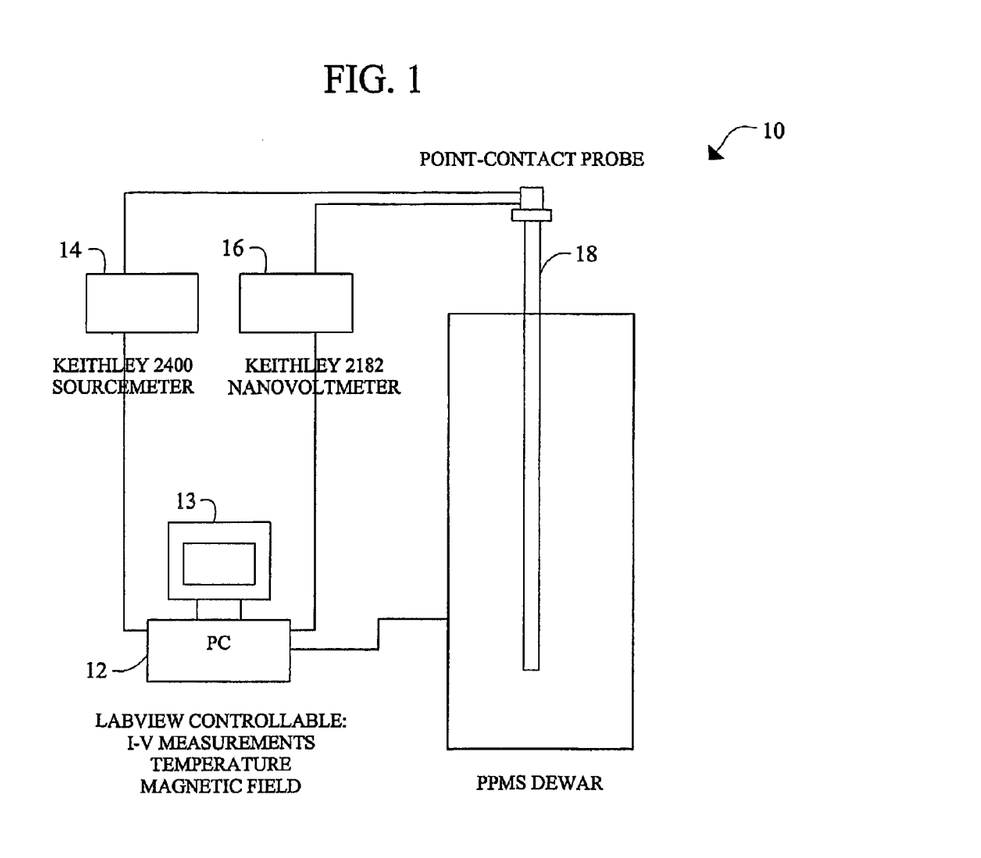
FIG. 1 is a schematic of the PCAR system.

Referring now to FIG. 1, it will there be seen that the reference numeral 10 denotes a schematic view of the novel setup as a whole. PC 12 having monitor 13 is connected to sourcemeter 14 and nanovoltmeter 16, both of which are electrically connected to point-contact probe 18 and both of which are commercially available from Keithley. The system also includes PPMS and LABVIEW® programs used to control the instrument.

More particularly, LABVIEW® software programming controls the desired current range, acquisition of voltage data, number of data points taken, as well as temperature and magnetic field control of the PPMS. It also controls data management by graphing the I vs. V curves in real-time on the monitor of PC 12 and sending the data to a separate file to be analyzed in EXCEL® and ORIGIN®.

Probe 18 is integrated into the PPMS. Sourcemeter 12 and nanovoltmeter 14 supply current and measure voltage, respectively. The two instruments allow acquisition of current (I) and voltage (V) data, which are differentiated numerically with a program such as EXCEL® to plot and analyze dI/dV vs. V curves. Obtaining dI/dV data is important in calculating the conductance spectra and spin polarization of the material.

Probe 18 integrates with the electronics and houses the sample, the superconducting tip, and the connecting wires, thereby enabling collection of I-V data. The probe schematics may be engineered to match the specifications of the type of measurement system that is used, specifically in diameter, length and vacuum seal requirements. In this preferred embodiment, probe 18 matches the specifications of the PPMS of Quantum Design.

Figure 2:
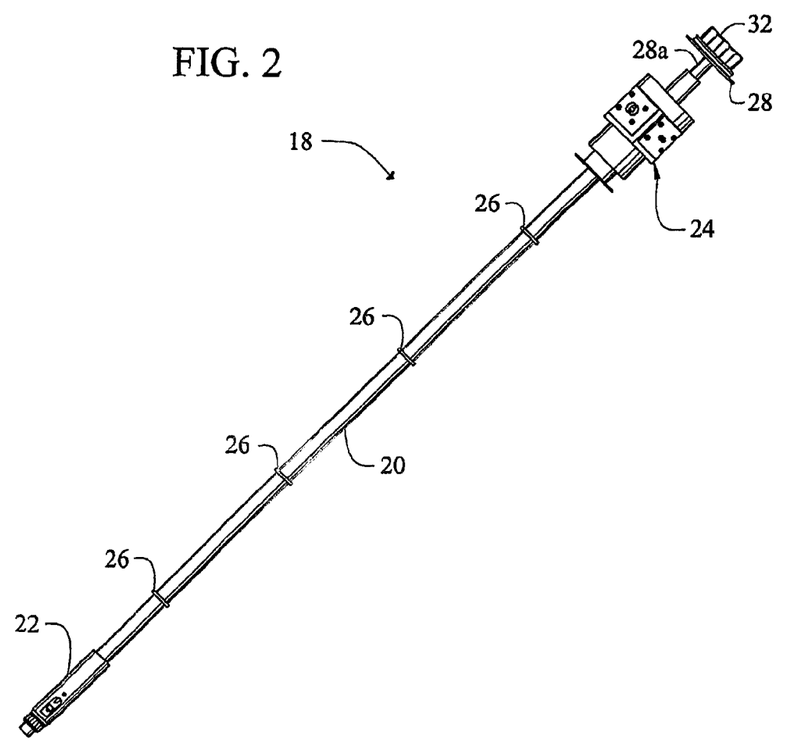
FIG. 2 is a perspective view of the Point Contact Andreev Reflection (PCAR) cryostat probe.

Referring now to FIG. 2, probe 18 preferably includes an elongate garolite tube 20. Garolite is a military-specified fiberglass reinforced, solid epoxy, board material. It is impervious to heat and moisture, never curls or warps or absorbs moisture. The material used for shaft 20 can be any material that is non-magnetic, somewhat rigid, and has a low coefficient of thermal expansion because it is used at a wide range of temperatures (from 0 to 300 Kelvin). Garolite is preferred because of its light weight, ease of machinability, and its low thermal conductivity that is essential for effective cryogenic probes to cut down heat transfer to the sample region. Other low thermal conductivity materials can be used for tube 20 and said materials are within the scope of this invention.

Copper housing 22 is mounted to the distal free end of tube 20 and vacuum-sealed aluminum housing 24 is positioned near the proximal end thereof. A plurality of spacers, collectively denoted 26, are equidistantly spaced along the extent of garolite tube 20 for placement into the PPMS neck and for wrapping coated copper wires from the tip and sample to the upper connectors.

Aluminum coarse control knob 28 is formed integrally with aluminum coarse adjustment rod 28a so that rotation of said coarse control knob 28 effects simultaneous and corresponding rotation of said coarse adjustment rod 28a. Knob 28 is preferably knurled to facilitate its turning. The distal end of coarse adjustment rod 28a is secured by a "C"-clamp, not shown, to the proximal end of stainless steel rod 30 (FIG. 3), in abutting relation thereto. Accordingly, rotation of coarse control knob 28 and hence coarse adjustment rod 28a in a clockwise direction pushes stainless steel rod 30 in a proximal-to-distal direction, i.e., towards a sample at the distal end of the probe and rotation of coarse control knob 28 and hence coarse adjustment rod 28a in a counterclockwise direction pulls stainless steel rod 30 in a distal-to-proximal direction, i.e., away from the sample at the distal end of the probe (assuming right-hand threads). The preferred diameter of stainless steel rod is 3/16". Stainless steel rod 30 is also referred to herein as micrometer rod 30 because the distal end of stainless steel rod 30 is received within a bore formed in the proximal end of a differential micrometer, disclosed hereinafter. Micrometer rod 30 is in axial alignment with coarse adjustment rod 28a and said differential micrometer.

Micrometer or fine control knob 32 is preferably formed of plastic and is also mounted to the proximal end of coarse adjustment rod 28a. When a pointed tip near the distal end of the probe is sufficiently close to a sample, fine control knob 32 is used to make the point contact and/or change the contact pressure and thereby the contact resistance between said pointed tip and the sample.

Figure 3:
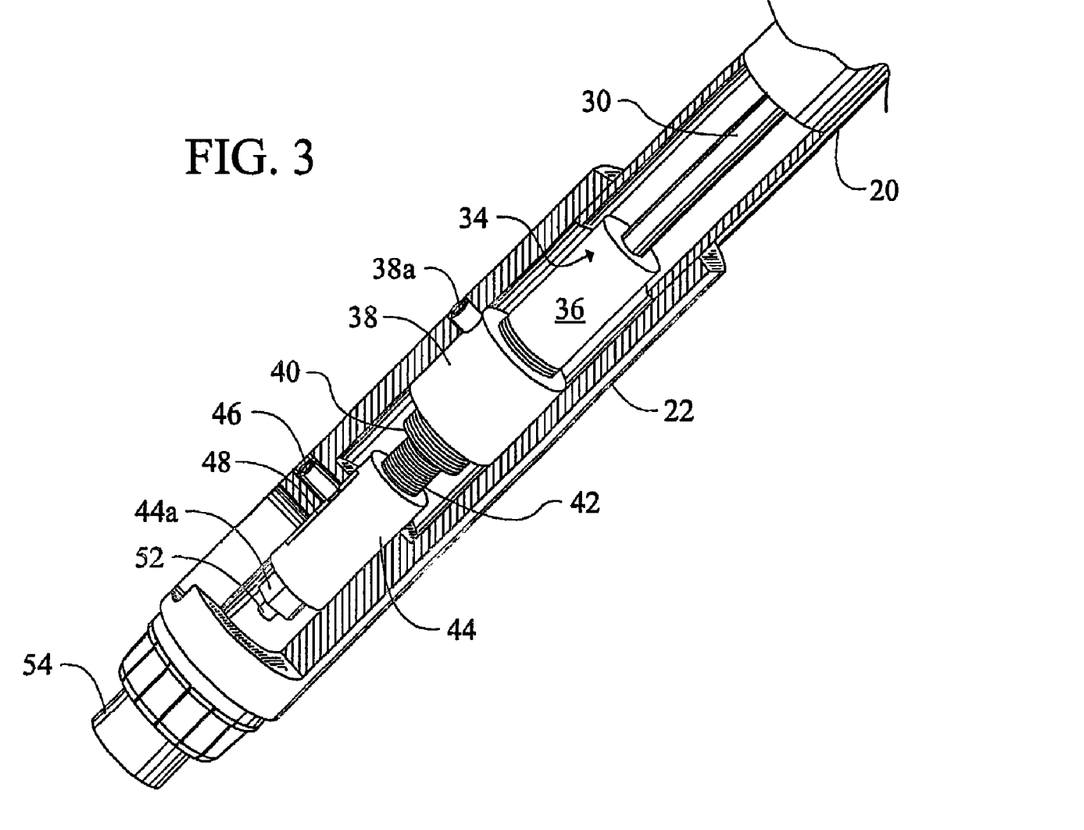
FIG. 3 is a broken away, perspective view of the distal end of the probe.
Figure 4A:
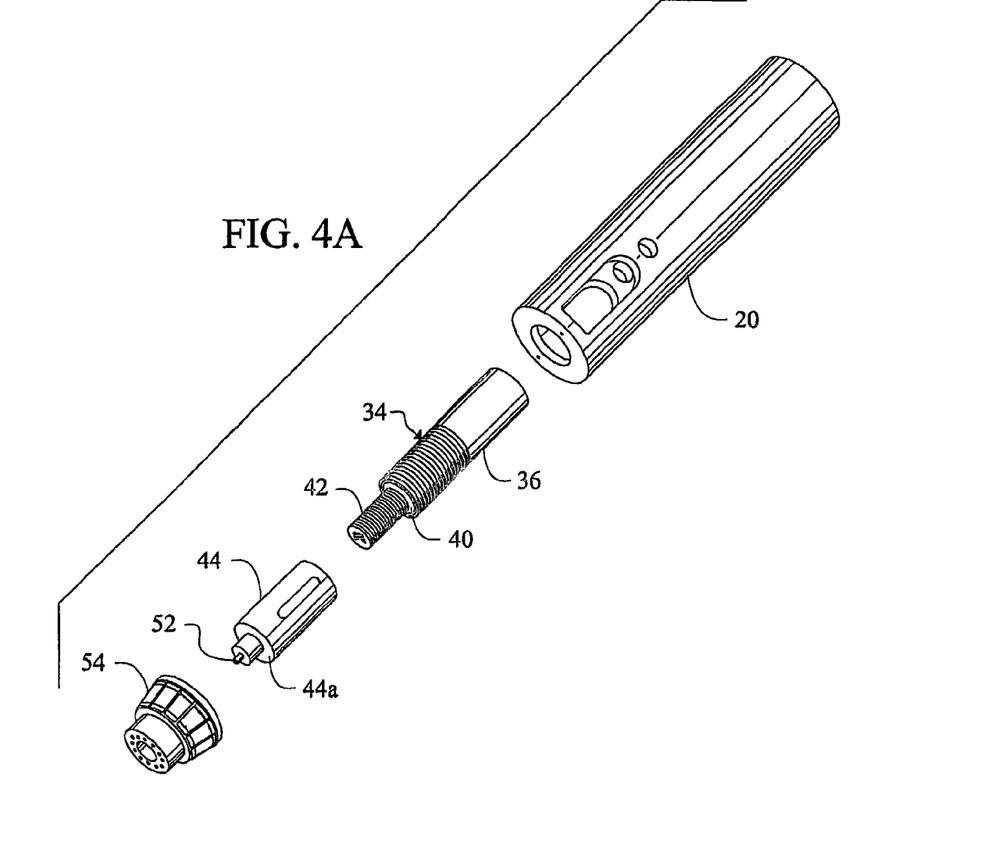
FIG. 4A is an exploded perspective view of said distal end.
Figure 4B:
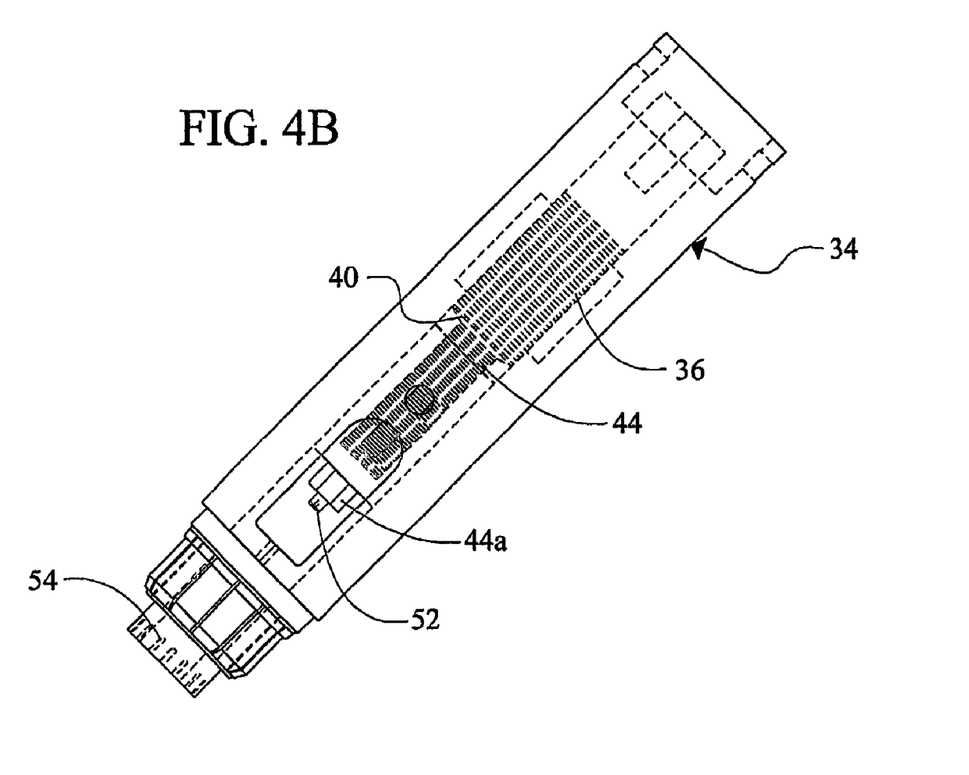
FIG. 4B is an elevational view of said distal end.

FIGS. 3, 4A and 4B provide a more detailed disclosure of the distal end of probe 18. Stainless steel rod 30 is ensleeved within garolite tube 20. Stainless steel rod 30 terminates within the proximal end of differential micrometer 34 and is locked therein with a setscrew that is not illustrated. Linear travel or translation of stainless steel rod 30 therefore effects simultaneous and corresponding linear travel of said differential micrometer 34.

Differential micrometer 34 includes coarse threads (27 threads per inch) formed on a large diameter part 36 thereof. Slider 38 screw-threadedly engages said coarse threads but does not rotate with respect thereto when coarse control knob 28 is rotated. As mentioned above, said slider is carried towards the sample when coarse adjustment knob 28 is rotated in a first direction and is withdrawn from the sample when said coarse adjustment knob is rotated in an opposite direction. When coarse control knob 28 is being rotated in either direction, slider 38 is held against rotation by setscrew 38a that is received within a longitudinally-extending slot formed in copper housing 22.

Differential micrometer 34 is stepped down in diameter at annular shoulder 40. Fine threads (28 threads per inch) are formed in the reduced diameter end 42 thereof. Internally threaded titanium sleeve 44 screw-threadedly engages said fine threads. Setscrew 46 extends through copper housing 22 and slightly into longitudinally-extending guide slot 48 formed in titanium sleeve 44, thereby preventing sleeve 44 from rotating but allowing it to translate, i.e., to travel longitudinally (axially) along the extent of reduced diameter end 42 when differential micrometer 34 is rotated.

Rotating fine adjustment knob 32 rotates differential micrometer 34. As mentioned above, said fine adjustment knob is secured to the proximal end of coarse adjustment rod 28a so it might be expected that rotation of fine adjustment knob 32 would cause linear travel of stainless steel rod 30 as when coarse adjustment knob 28 is rotated because both adjustment knobs are connected to said coarse adjustment rod. However, as mentioned above, coarse control knob 28 is formed integrally with coarse adjustment rod 28a so said parts rotate as a unit. However, rotation of fine control knob 32 effects rotation of stainless steel rod if a user initiates rotation of said fine control knob in an abrupt manner. Rapid application of torque to fine control knob 32 causes setscrew 38a to abruptly rotate a short distance so that it bears against the side of the slot through which said setscrew extends. When setscrew 38a bears against said slot, slider 38 is held against linear translation, or sliding. Continued rotation of said fine control knob 32, in the same direction as the initial abrupt rotation, thus causes stainless steel rod 30 to rotate with respect to non-rotating slider 38 and to therefor translate along a linear path of travel toward the sample or away from the sample, depending upon the direction of rotation of said fine control knob 32.

Tip 52 is positioned within a 1/16" longitudinally-extending blind bore formed in tip holder 44a. The blind bore is lined with a cylindrical gold sheath. Tip 52 is formed of superconducting elements such as tin, lead, or niobium. Before soldering tip 52 to the cylindrical gold sheath, the tip is formed into a cone-shaped point with a grinder. Electrochemical etching can be performed too to achieve sharp tips. Next, several grades of 3M diamond-aluminum oxide lapping paper are used to sand the tip to a sharp point. The tip is then thoroughly cleaned with acetone and/or methanol before being mounted above the sample. Two copper wires are then connected to the proximal end of tip 52 using Indium and/or Sn/Pb alloy solder. With this method, two contacts are made to the tip and two to the sample.

The distal end of titanium sleeve 44 is machined to 28 threads per inch to fit into tip holder 44a. Any suitable metal or other known material that is non-magnetic and has a low coefficient of expansion may be used for housing 22 and sleeve 44, A conventional PPMS resistivity puck 54 screw-threadedly engages the distal end of copper housing 22. The sample is mounted on resistivity puck 54 with varnish and/or vacuum grease, and the two leads are connected with indium solder, Sn/Pb alloy solder, or Ag conductive ink. Having two leads on the proximal end of tip 52 and two leads on the sample enables a standard four-probe current-voltage measurement and the I-V characteristics across the tip/sample junction can be measured accurately.

Differential micrometer 34 enables tip 52 to be translated up and down the shaft (away from and toward the sample, respectively) with fine control as aforesaid. This serves the dual purpose of changing the gap distance between the tip and sample and thus the junction resistance and enabling tip 52 to pierce any native oxide layer that might be present. A native oxide layer is likely to be present when working with $CrO_2$ because $CrO_2$ is known to build up an anti-ferromagnetic insulating layer of $Cr_2O_3$ in the presence of oxygen gas. The novel apparatus has the advantage of being able to use the micrometer along with a short, sturdy sharp tip (element 52) to penetrate this barrier and make contact with the ferromagnetic metallic $CrO_2$. This is useful in studying other materials too where there is a need to penetrate a defective surface layer to make contact with the cleaner underlayer.

Experimental temperatures may go as low as to 2.0 Kelvin. Accordingly, differential micrometer 34 is made of titanium to take advantage of the low thermal coefficient of expansion of titanium. Differential micrometer 34 is machined with twenty-seven (27) threads per inch in its large diameter proximal end 36 and twenty-eight (28) threads per inch in its reduced diameter distal end 42 as mentioned above. Titanium sleeve 44 travels longitudinally relative to the threads formed in reduced diameter section 42 (28 threads per inch) and thus relative to copper housing 22 when said fine adjustment knob 32 is used in the manner disclosed above. Tip holder 44a and hence tip 52 travel longitudinally relative to titanium sleeve 44. The difference between 27 threads per inch and 28 threads per inch of the two pieces is the translation of sleeve 44 relative to copper housing 22. This works out to be $\frac{1}{27}-\frac{1}{28}=0.0013''$ or 1.3 thousandths of an inch per revolution. There are twelve (12) revolutions available in the sleeve. This range allows several different gap resistances to be established for a given junction. Rotation of micrometer knob 28 by angular amounts less than one full revolution provides further fine tuning to achieve smaller translation.

Figure 5A:
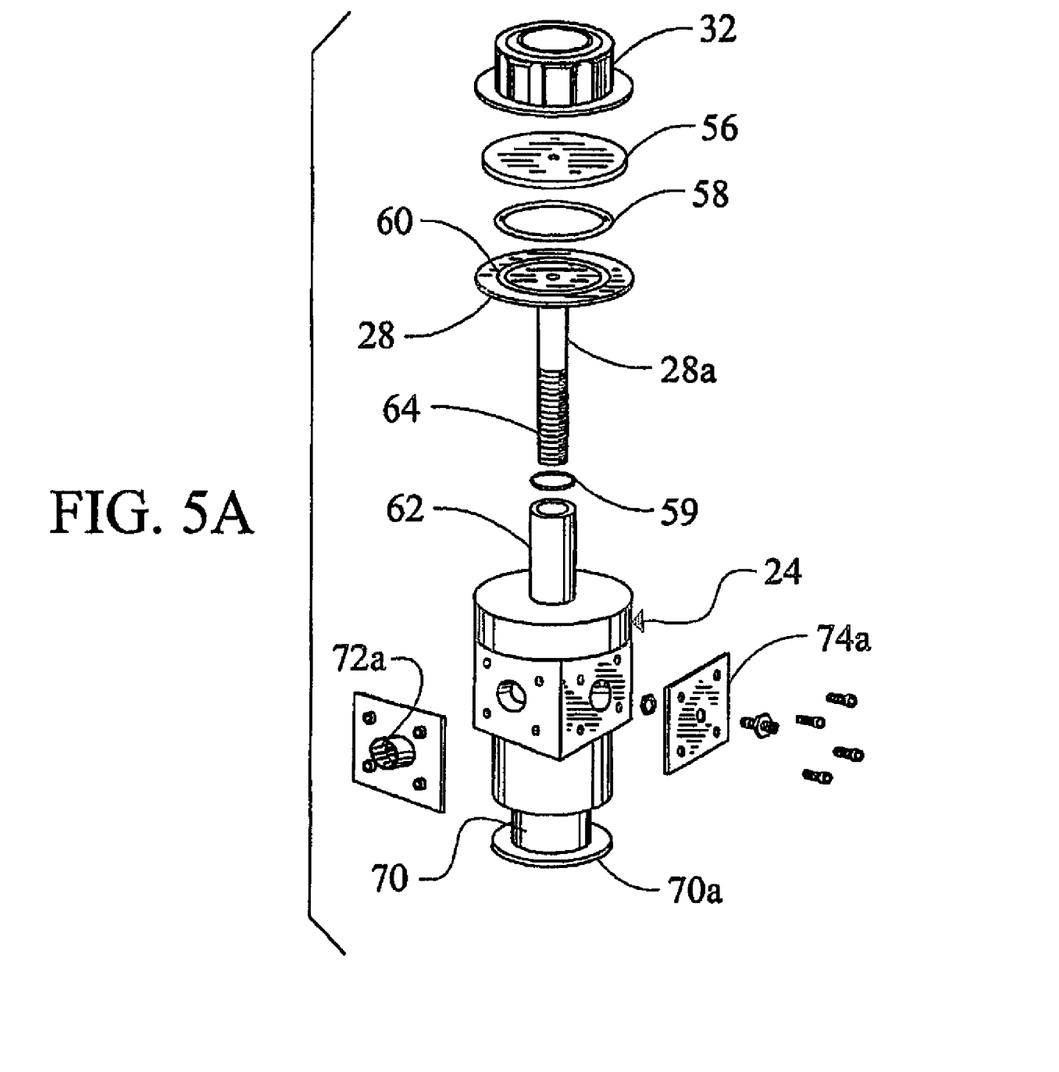
FIG. 5A is a first exploded perspective view of the proximal end of the probe.
Figure 5B:
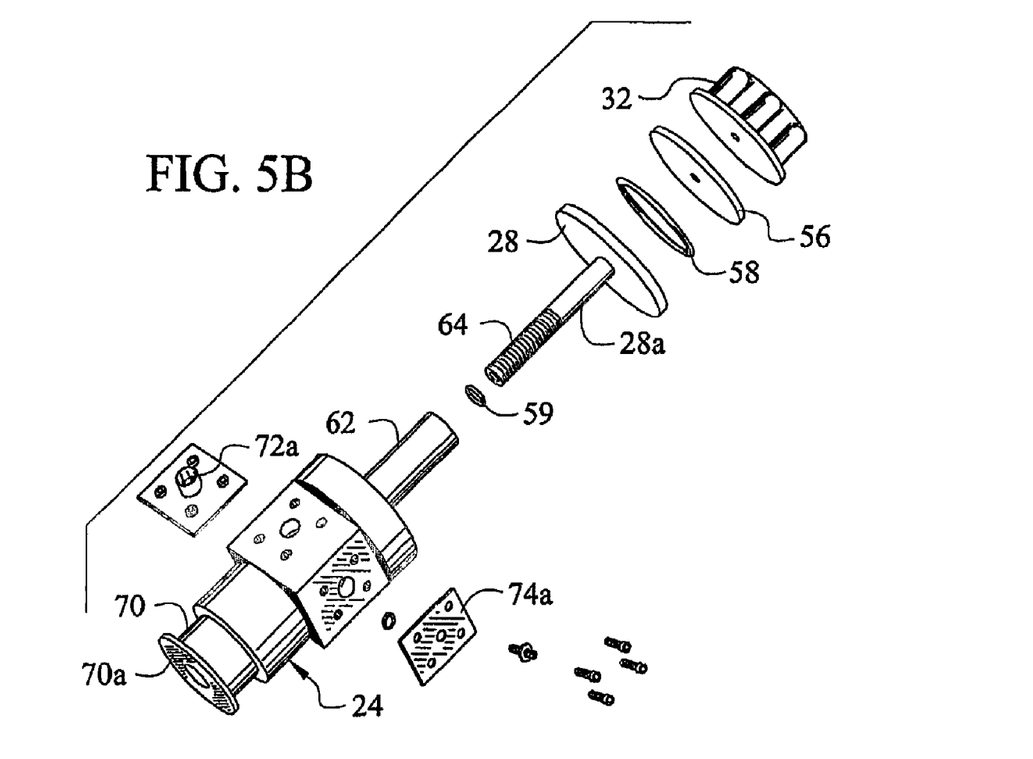
FIG. 5B is a second exploded perspective view of the proximal end of the probe.
Figure 6:
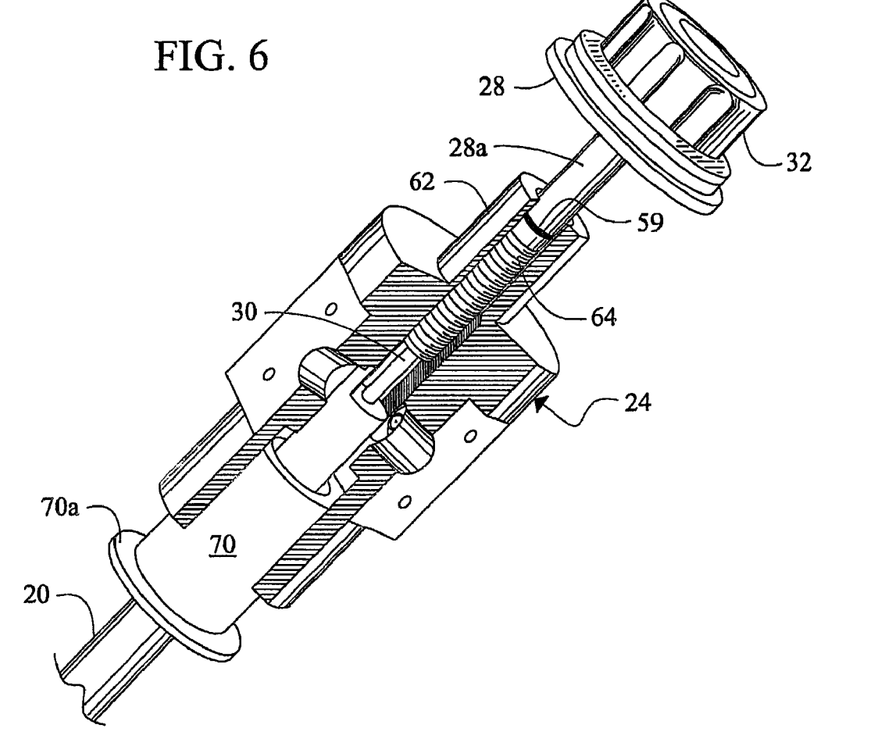
FIG. 6 is a cut away perspective of said proximal end.
Figure 7A:
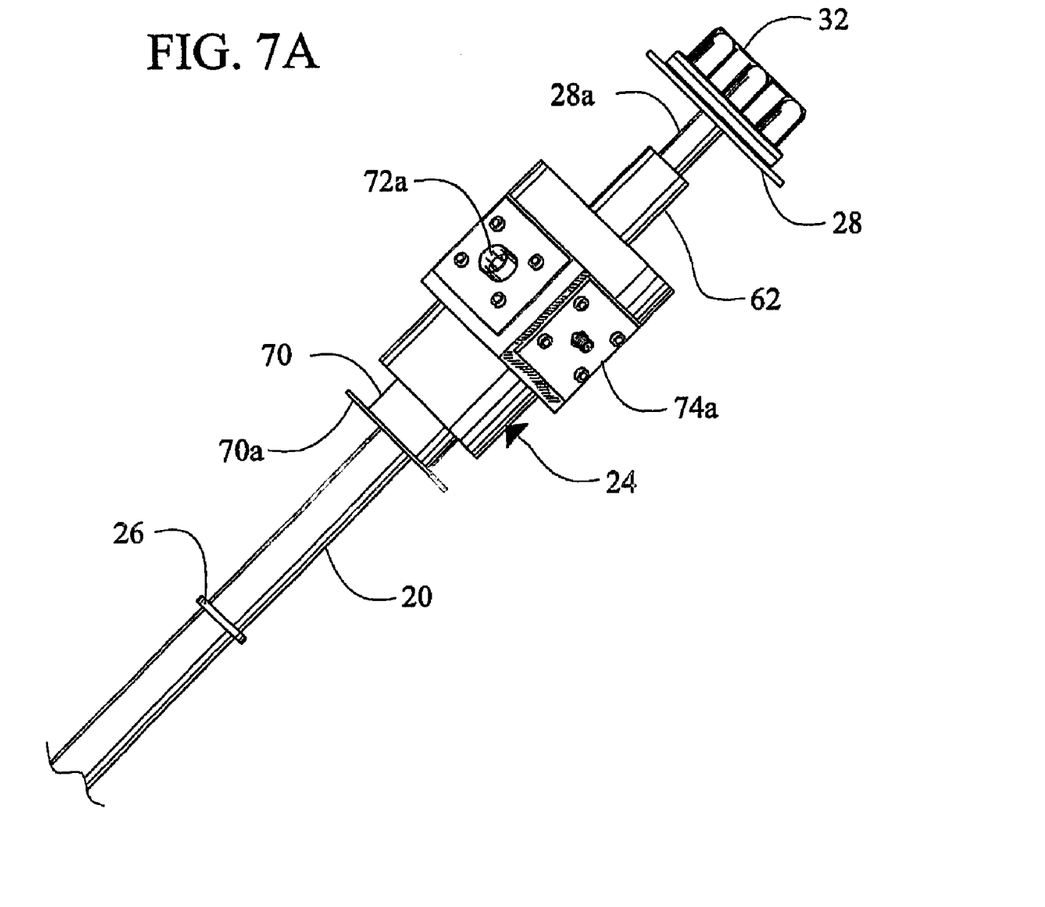
FIG. 7A is an elevational view of the proximal end of the probe in its assembled configuration.
Figure 7B:
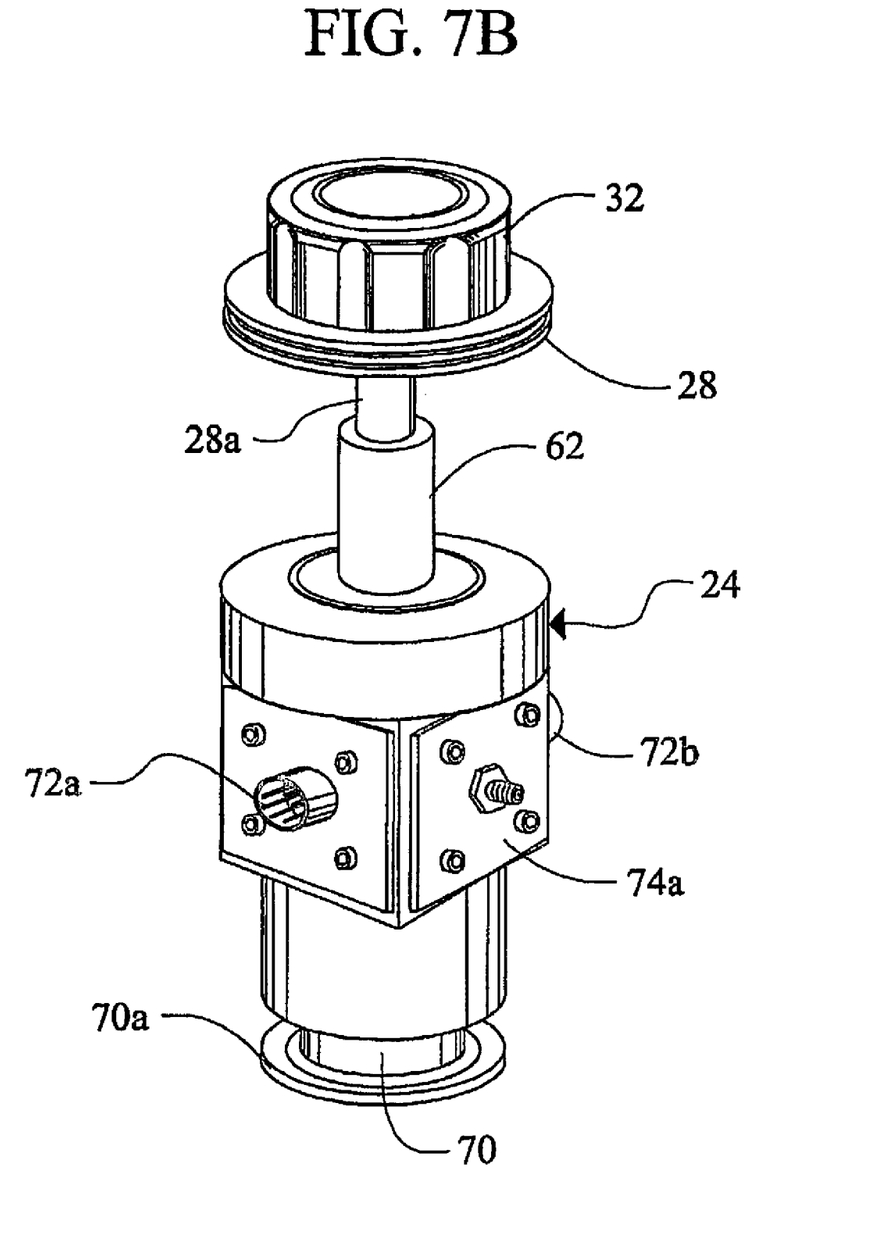
FIG. 7B is a perspective view of the proximal end of the probe in its assembled configuration.

Vacuum sealed aluminum housing 24 is depicted in exploded view in FIGS. 5A and 5B and a cut-away view is provided in FIG. 6. FIGS. 7A and 7B provided assembled views and FIG. 8 provides a view of an embodiment lacking a coarse control knob and its related parts.

More particularly, disc 56 is part of a Wilson seal arrangement. Disc 56 maintains an O-ring joint, allowing rotation without breaking vacuum. Disc 56 and large O-ring 58 (FIGS. 5A and 5B) are sandwiched between micrometer adjustment knob 32 and coarse adjustment knob 28. Large O-ring 58 is received within annular groove 60 (FIG. 5A) formed in coarse adjustment knob 28. Boss 62 of aluminum housing 24 is internally threaded and screw-threadedly engages external threads 64 formed in aluminum rod 28a.

Figure 8:
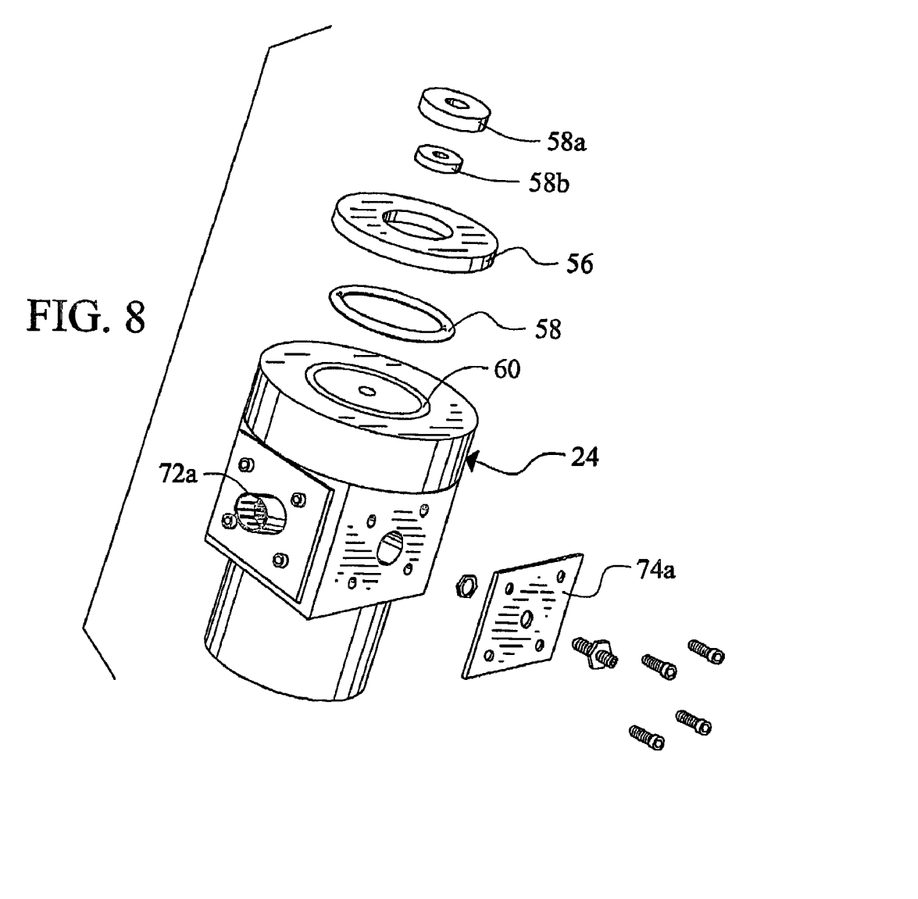
FIG. 8 is an exploded view of the aluminum housing of the PCAR cryostat probe, specifically showing the positioning of several O-rings in a Wilson seal configuration.

As best understood in connection with FIG. 8, the Wilson seal arrangement further includes specifically chamfered O-rings 58a and 58b. O-rings 58a, 58b are smaller in diameter than O-ring 58 because they seal aluminum rod 28a. Said O-rings 58a, 58b rotate conjointly with aluminum disc 56. More particularly, small O-ring 58b fits within the central aperture of larger O-ring 58a and said larger O-ring 58a fits within the central aperture of disc 56.

Probe 18 further includes O-ring 59 placed inside boss 62 as best understood in connection with FIGS. 5A, 5B, and 6. More O-rings may be used. Moreover, any sealing means that functions as a suitable substitute for one or more O-rings may also be used.

FIG. 6 further depicts flanged part 70 (having flange 70a) that includes a central throughbore to slidingly receive garolite tube 20 therethrough. The distal end of housing 24 mates with said flanged part 70 and is therefore vacuum-sealed. Suitable sealing means, such as O-rings or the like, are used to seal the interface between housing 24 and flanged part 70.

Boss 62 provides a mounting means for one or more O-rings to maintain a good vacuum seal. Boss 62 is internally threaded at 20 threads per inch to screw threadedly engage external threads 64 formed in coarse control rod 28a that is formed integrally with coarse control knob 28 as aforesaid. Boss 62 is machined at ½-20, or ½" inner diameter and said twenty (20) threads per inch. Coarse control rod 28a is machined with matching threads 64 over the distal 1¾" of its travel. Thus, there are 35 revolutions available for wiring the tip and sample in the sample space and moving the sharpened tip into close proximity prior to the cooling process.

Aluminum housing 24 is generally cylindrical as aforesaid but four (4) flats are formed therein in equidistantly and circumferentially spaced relation to one another. Each flat has a flat electrical connector panel mounted thereto. As best depicted in FIGS. 7A and 7B, connector panels 72a and 72b are diametrically opposed to one another and one of said panels may include an 8 pin circular connector and its diametrically opposed counterpart may include a 10 pin circular connector, for example. High-frequency SMA connector panels 74a, 74b (74b is not shown) are also diametrically opposed to one another and are positioned in flats that are normal to the flats that receive said panels having circular connectors. The depicted connectors are for illustrative, exemplary purposes only. The type of connectors employed is not critical to the invention.

Each of the four flats has a counter-sunk groove with a 1¼" outer diameter and a 1.150" inner diameter O-ring. Each of the connectors have O-ring seals, and the 10-pin and 8-pin circular connectors have a commercially-available Torr Seal (an epoxy that seals glass-metal connectors vacuum tight) between the flat mounting surface and the panel. O-rings are sufficient to seal panels 74a, 74b. The type of seal is a function of the type of connector employed.

The distal end of aluminum housing 24 is machined to have an inner diameter of 1½" to match the commercial fitting from a standard Quantum Design Probe. A double O-ring system is preferably machined at this junction although, again, the invention is not limited to any particular type of sealing means. A small clearance exists between the inner diameter of the commercial fitting and the outer diameter of garolite tube 20.

Aluminum housing 24 is initially vacuum tested in the PPMS during a liquid helium run. The amount of vacuum grease on each O-ring is adjusted and the torque on each of the Allen screws varies. A successful seal is achieved and there is very low pressure inside the sample space. Probe 18 holds a pressure of 0.65 Torr at a temperature of 2.0 Kelvin. This is remarkable stability at low temperatures for probe 18.

By varying the contact area mechanically, many PCAR measurements with different contact resistances may be performed on the same film using the same tip. The inside of the copper sliding part is threaded with a $\frac{1}{2}$28 die to match with the existing titanium micrometer part. Thus the entire assembly can be moved to a point-tip separation distance and then switched to fine translation knob 28 to establish different contact resistances before taking data. The sliding part achieves a vertical translation, i.e. the z-axis translation stage. Other translation stage, an x-y stage, to achieve lateral motion so that point contact junctions can be made in situ at several places on the sample surface may also be developed.

Studies have been made on a number of junctions using the PCAR probe. Such studies have observed Andreev reflection (AR) in superconductor-normal metal junctions and suppression of AR in superconductor-half metal junctions. In all cases, data may be collected at different temperatures below the superconducting critical temperature (Tc) and at a number of fixed fields up to the critical field (Hc) of the superconductor. A graph of the field dependence data for Sn—$CrO_2$ junction, showing normalized conductance vs. bias voltage may be generated. Data may also be taken for the Nb—Cu junction, where the field dependence can be shown for several values below and above the critical field, Hc of the superconducting tip. An experiment may be performed in the PPMS at a stable temperature of 5.00 Kelvin, well below the transition temperature of Nb at 9.50 Kelvin. The distinct features associated with Nb superconducting gap of $\Delta=\pm1.53$ meV will show up clearly in such an experiment. The magnetic field may be set at 0 Gauss, 500 Gauss, 2000 Gauss, 5000 Gauss, and 1 Tesla. The data at these fields will show varying degrees of suppression of the superconductivity in Nb.

The magnetic field dependence of the dI/dV vs. V characteristics for the Sn—$CrCO_2$ junction may also be displayed in graphical form. Moreover, the temperature dependence of the dI/dV vs. V characteristics for the Sn—$CrCO_2$ junction may also be so displayed. The data is collected at a constant 2.00 K temperature, well below the transition temperature of Sn and with a varying magnetic field.

The PCAR measurement system as developed and described herein is a unique and versatile apparatus for investigation of spin polarization in materials. The flexibility afforded by integration with the PPMS with a variable magnetic field capability and large range of temperatures makes the probe useful for many types of experiments. As disclosed herein, Andreev reflection measurements for half metals such as $CrO_2$ were taken at a constant temperature as low as 2K. Thus, the novel probe has provided the benefit of greater temperature control than heretofore attainable, as well as magnetic field control. The novel probe has produced successful results for conventional Andreev reflection in normal metals and suppression of Andreev reflection in half metals.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall there-between.

Now that the invention has been described,

What is claimed is:

1. A point contact probe for measuring spin polarization of a sample, comprising:
   an elongate tube;
   a vacuum-sealed housing mounted to said elongate tube near a proximal end thereof;
   said vacuum-sealed housing adapted for connection to a temperature and magnetic field control apparatus;
   said temperature and magnetic field control apparatus being a physical property measurement system;
   said vacuum-sealed housing also adapted for electrical connection to a sourcemeter and a voltmeter;
   a sample housing secured to said tube near a distal end thereof;
   a tip holder mounted within said sample housing;
   a superconducting tip extending from a distal end of said tip holder;
   said superconducting tip being in electrical communication with said physical property measurement system;
   a sample holder secured to a distal end of said sample housing;
   said sample holder adapted to hold a sample;
   control means for controlling a distance between said sample and said superconducting tip;
   said control means adapted to retract and extend said superconducting tip away from and toward, said sample, respectively;
   said control means including a rotatably mounted coarse control knob positioned at a proximal end of said elongate tube;
   said rotatably mounted coarse control knob being formed integrally with a coarse adjustment rod so that rotation of said coarse control knob in a first rotational direction effects simultaneous and corresponding rotation of said coarse adjustment rod in said first rotational direction and so that rotation of said coarse control knob in a second rotational direction opposite to said first rotational direction effects simultaneous and corresponding rotation of said coarse adjustment rod in said second rotational direction;
   said control means further including a differential micrometer;
   said differential micrometer including a shaft having a diameter-reducing annular shoulder formed therein that divides a first, large diameter proximal section of said shaft from a second, reduced diameter distal section of said shaft;
   said proximal section of said shaft being externally threaded and having a first preselected number of threads per unit length formed therein;
   said distal section of said shaft being externally threaded and having a second preselected number of threads per unit length formed therein;
   an internally threaded slider in screw-threaded engagement with said proximal section of said shaft;
   an internally threaded sleeve in screw-threaded engagement with said distal section of said shaft;

said tip holder mounted to a distal end of said internally threaded sleeve;
a micrometer rod disposed in axial alignment with said coarse adjustment rod:
a distal end of said coarse adjustment rod disposed in abutting relation to a proximal end of said micrometer rod;
clamp means for securing together said coarse adjustment rod and said micrometer rod;
said differential micrometer including an internally threaded boss that screw threadedly engages said coarse adjustment rod;
whereby rotation of said coarse adjustment rod in said first rotational direction causes said coarse adjustment rod to advance in a first linear direction and to bear against said micrometer rod and to displace said micrometer rod and hence said differential micrometer and said tip holder in said first linear direction; and
whereby rotation of said coarse adjustment rod in said second rotational direction causes said coarse adjustment rod to displace in a second liner direction opposite from said first linear direction and to displace said micrometer rod and hence said differential micrometer and said tip holder in said second linear direction;
said control means further including a fine adjustment knob secured to a proximal end of said coarse adjustment rod;
an elongate slot formed in said internally threaded slider;
a setscrew opening formed in said sample housing;
a setscrew that extends through said opening and into said elongate slot to prevent rotation of said slider;
said setscrew bearing against a first side of said elongate slot when said fine adjustment knob is abruptly rotated in a first rotational direction so that continued rotation of said fine adjustment knob in said first rotational direction causes said differential micrometer to rotate in said first rotational direction relative to said internally threaded slider and to travel in a first linear direction;
said setscrew bearing against a second side of said elongate slot when said fine adjustment knob is abruptly rotated in a second rotational direction opposite to said first rotational direction so that continued rotation of said fine adjustment knob in said second rotational direction causes said differential micrometer to route in said second rotational direction relative to said internally threaded slider and to travel in a second linear direction opposite to said first linear direction;
said linear travel in said first direction of said differential micrometer causing said internally threaded sleeve and hence said tip holder to travel in a first linear direction toward said sample; and
said linear travel in said second direction of said differential micrometer causing said internally threaded sleeve and hence said tip holder to travel in a second linear direction away from said sample.

2. The probe of claim 1, further comprising:
said physical property measurement system being adapted to maintain a consistent low temperature within the probe of about 2 Kelvin.

3. The probe of claim 1, further comprising:
said sample being a thin film selected from a group consisting of Cu, $MgB_2$, and $CrO_2$.

4. The probe of claim 1, further comprising:
said superconducting tip being made of a metal, said metal being selected from a group of metals consisting of Ni, Pb, Nb and Sn.

5. The probe of claim 1, further comprising:
said internally threaded sleeve being made from titanium.

6. The probe of claim 1, further comprising:
said vacuum-sealed housing being made of aluminum.

7. The probe of claim 1, further comprising:
said differential micrometer being made from copper.

8. The probe of claim 1, wherein the internally threaded slider is made from a metal, said metal being selected from a group of metals consisting of copper and titanium.

9. The probe of claim 1, further comprising:
said elongate tube being made from a nonmetallic and nonmagnetic glass fabric woven into a resin.

10. The probe of claim 1, further comprising:
said elongate tube being made of garolite.

11. The probe of claim 1, further comprising:
said elongate rube having a length between one-half to two meters.

12. The probe of claim 1, further comprising:
a plurality of double O-rings disposed within said vacuum-sealed housing to inhibit leaking of a vacuum created within said vacuum-sealed housing by said temperature and magnetic field control apparatus.

13. The probe of claim 1, further comprising:
said temperature and magnetic field control apparatus adapted to maintain a temperature within said probe within a temperature range of 2 to 300 degrees Kelvin.

14. The probe of claim 1, further comprising:
said temperature and magnetic field control apparatus adapted to maintain a magnetic within said probe within a range of 0 to 70,000 Gauss.

15. The probe of claim 1, further comprising:
said superconducting tip adapted to measure the spin polarization of a thin film of $CrO_2$.

16. The probe of claim 1, further comprising:
said superconducting tip being made of tin.

* * * * *